United States Patent
Lin (10) Patent No.: US 9,503,033 B2
(45) Date of Patent: Nov. 22, 2016

(54) AUDIO AMPLIFIER MODE TRANSITION

(71) Applicant: HEWLETT-PACKARD DEVELOPMENT COMPANY, L.P., Houston, TX (US)

(72) Inventor: Hsin-Tso Lin, Taipei (TW)

(73) Assignee: Hewlett-Packard Development Company, L.P., Houston, TX (US)

( * ) Notice: Subject to any disclaimer, the term of this patent is extended or adjusted under 35 U.S.C. 154(b) by 498 days.

(21) Appl. No.: 13/852,089

(22) Filed: Mar. 28, 2013

(65) Prior Publication Data
US 2014/0294204 A1    Oct. 2, 2014

(51) Int. Cl.
| | |
|---|---|
| *H03F 3/181* | (2006.01) |
| *H03F 3/183* | (2006.01) |
| *H03F 3/185* | (2006.01) |
| *H03F 1/30* | (2006.01) |

(52) U.S. Cl.
CPC .............. *H03F 3/181* (2013.01); *H03F 1/305* (2013.01); *H03F 3/183* (2013.01); *H03F 3/1855* (2013.01)

(58) Field of Classification Search
None
See application file for complete search history.

(56) References Cited

U.S. PATENT DOCUMENTS

| | | | | |
|---|---|---|---|---|
| 7,804,967 | B2* | 9/2010 | Kang | H03F 1/305 330/207 A |
| 8,325,940 | B2* | 12/2012 | Larsen | H03F 1/305 330/10 |
| 2008/0049952 | A1 | 2/2008 | Jung et al. | |
| 2008/0144857 | A1 | 6/2008 | Huang et al. | |
| 2008/0240469 | A1* | 10/2008 | Suzuki | 381/120 |
| 2010/0004936 | A1* | 1/2010 | Chao | 704/500 |
| 2010/0092009 | A1* | 4/2010 | Shimomura | 381/120 |
| 2010/0128898 | A1 | 5/2010 | Wong | |
| 2013/0223646 | A1* | 8/2013 | Lee et al. | 381/94.5 |

OTHER PUBLICATIONS

Parikh et al., "Implementation of Blind Source Separation and post-Processign Algorithm for Noise Suppression in Cell-Phone Applications," IEEE, Mar. 14, 2010. <http://ieeexplore.ieee.org/xpl/login.jsp?tp=&arnumber=5495536&url=%2Fstamp%2Fstamp.jsp%3Ftp%3D%26arnumber%3D5495536>.

* cited by examiner

*Primary Examiner* — Curtis Kuntz
*Assistant Examiner* — Kenny Truong
(74) *Attorney, Agent, or Firm* — HP Inc Patent Department (57) ABSTRACT

An audio amplifier is to transition between a power-down mode and an active mode, based on assertion and deassertion of a power down signal. A power down control module is to selectively assert and deassert the power down signal to the audio amplifier. The power down control module may identify at least one of a digital detection signal and an analog detection signal. The digital detection signal indicates the availability of a digital audio signal to be amplified, and the analog detection signal indicates the availability of an analog audio signal to be amplified.

17 Claims, 5 Drawing Sheets

Truth Table

| External PD# | PG# | AD# | DD# | Amplifier out |
|---|---|---|---|---|
| L | Don't care | Don't care | Don't care | No output |
| H | H | Don't care | Don't care | No output |
| H | L | L | Don't care | output |
| H | L | Don't care | L | output |
| H | L | H | H | No output |

External PD# : external Power down pin signal
PG# : Power good signal
AD# : Analog sound detection signal
DD#: Digital sound detection signal
L : The signal is asserted
H: The signal is deasserted

AUDIO AMPLIFIER MODE TRANSITION

BACKGROUND

Audio amplifiers may be used in computing environments, for amplifying analog and digital signals. The audio amplifier consumes power and may be transitioned to a powered-down state to conserve energy. However, the audio amplifier may produce popping noises or cause other issues during operation.

DETAILED DESCRIPTION

Audio platforms may include the ability to amplify audio signals, and power down an audio amplifier. However, audio platforms including desktop (DT) module platforms, may be based on relatively expensive embedded controllers such as microcontroller units (MCUs) for audio control, and may not include the capability of autodetection for analog audio signals. As a result, a DT platform may use an external circuitry, without needing to use an MCU, to control, e.g., when an audio codec should go into a sleep mode. However, use of external circuitry and/or an MCU may consume additional power and create a power on pop-up noise that can degrade the amplified audio signal quality. External circuitry may control a sleep mode by disabling the amplifier via an external power down (PD) signal. However, the external power down signal may enable a limited functionality, without providing full control over the audio codec. For example, the external power down signal may not enable full control over a power down and power up sequence, including fine tuning and tailoring the use of the audio amplifier to save power while avoiding distortion such as popping.

Examples provided herein demonstrate the ability to autodetect an audio input signal for activating the audio amplifier, enabling an audio platform to enjoy less power consumption while resolving power on pop-up noises. Furthermore, products based on examples herein may enjoy reduced development cycle time and lower bill of materials (BOM) cost, because they do not need extra external circuitry to control when an audio codec should go into sleep mode, nor do they need additional development time to be fine-tuned or otherwise synchronized with such external circuitry (e.g., for the timing to control an external power down pin of the audio codec).

In an example, a codec may control itself without use of an MCU or other controller, and autodetect whether to transition the audio amplifier between active and standby modes. For example, by autodetecting that there is no audio signal present to be amplified, the codec therefore may identify that there is no reason to enable the internal audio amplifier. Operational behavior may be embedded into codec itself, including the ability to monitor power up and available power quality.

Figure 1:
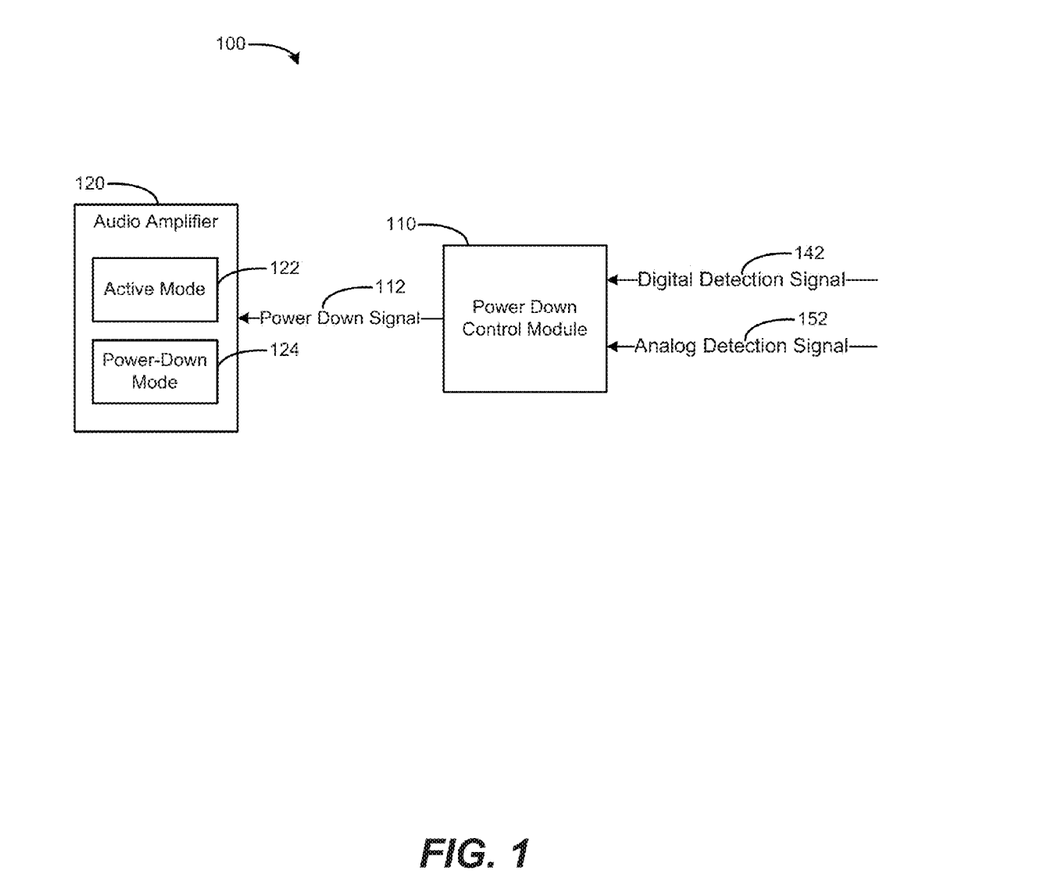
FIG. 1 is a block diagram of an audio amplifier system including a power down control module according to an example.

FIG. 1 is a block diagram of an audio amplifier system 100 including a power down control module 110 according to an example. System 100 also includes an audio amplifier 120. The audio amplifier 120 includes an active mode 122 and a power-down mode 124. The audio amplifier 120 may transition between the active mode 122 and the power-down mode 124 based on a power down signal 112. The power down control module 110 may generate the power down signal 112, based on a digital detection signal 142 and/or an analog detection signal 152.

Audio amplifier 120 is associated with amplifying sounds originating from an analog audio path and a digital audio path. For example, the audio amplifier 120 may receive an analog mixed signal from a sound mixer, which may receive its audio signals to be mixed from either of the audio paths (e.g., a D/A process block may convert digital sounds from the digital audio path to analog before passing them to the sound mixer, which also may receive analog sounds from the analog audio path for mixing). System 100 has the ability to enable the audio amplifier 120 into the active mode 122, based on not only the digital detection signal 142, but also the analog detection signal 152. This functionality is self-contained in system 100, without needing to rely on an external power down signal or other additional external control circuitry to provide such a signal. The ability to autodetect whether to transition the audio amplifier 120 may be self-contained within the power down control module 110. Furthermore, avoiding a need for additional external control circuitry enables system 100 to avoid noises that would be introduced with extra time needed to transition the amplifier, e.g., power on pop up noises or trimming of audio signals.

The power down control module 110 includes power down control logic to determine internal power down signal behavior, to enable and/or disable a power down mode of the audio amplifier 120, e.g., an integrated amplifier of an audio codec. For example, if no sound is being input, the digital detection signal 142 and the analog detection signal 152 will not be asserted at the power down control module 110. Absent those signals, the power down control module 110 may itself determine to assert the power down signal 112, to put the audio amplifier 120 in the power-down mode 124, even without receiving external guidance (e.g., without needing an external power down signal). In alternate examples the external power down signal may be used, and behavior of system 100 may be fine-tuned to internally control behavior of the audio amplifier 120 to move beyond the limitations of needing external guidance.

Internally controlling the behavior of system 100 enables enhancements such as the ability to provide hardware control even before software drivers have had a chance to load, such as during a time when very low-level system sounds may be generated. For example, system 100 in a personal computer (PC) environment may detect a "beep" sound during a boot-up sequence, prior to loading operating system drivers. Such sound detection may involve analog sound detection, at which point a typical software driver would be unavailable or simply unable to perform such detection, including detection of real-time hardware-based analog sound sources. The system 100 enables the avoidance of missing such sounds, by intelligently monitoring even these kinds of input, to place the audio amplifier 120 into the active mode 122 as appropriate to output sounds without missing them, saving power while avoiding pop noises.

Figure 2:
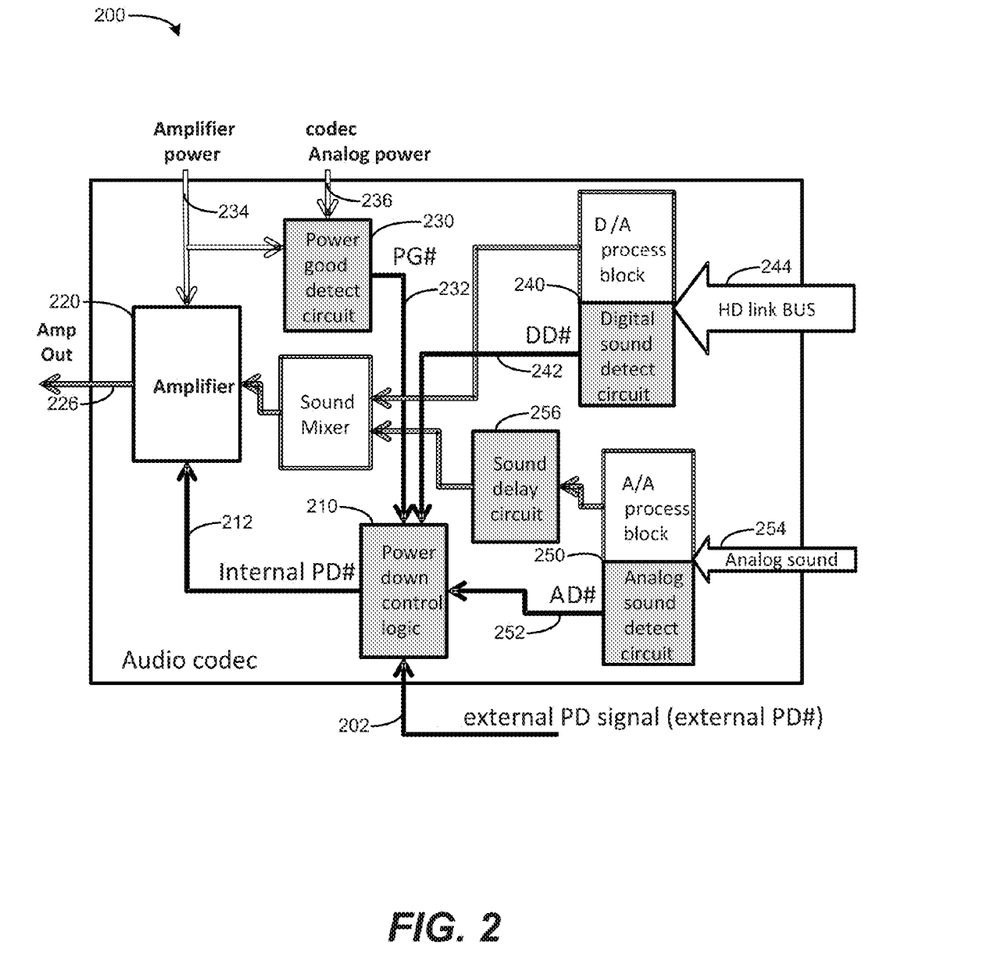
FIG. 2 is a block diagram of an audio amplifier system including a power down control module according to an example.

FIG. 2 is a block diagram of an audio amplifier system 200 including a power down control module 210 according to an example. In the example of FIG. 2, the audio amplifier system 200 is shown as an audio codec, although other forms are possible including other hardware circuits and/or software modules. The power down control module 210 is to assert and deassert a power down signal 212 to an audio amplifier 220. According to the assertion or deassertion of the power down signal 212, the audio amplifier 220 is to selectively provide amplifier out 226, based on amplifying a digital audio signal 244 and/or an analog audio signal 254. The digital audio signal 244 is received at a digital sound detection module 240, which may assert a digital detection signal 242 to the power down control module 210. The analog audio signal 254 is received at an analog sound detection module 250, which may assert an analog detection signal 252 to the power down control module 210. The analog sound detection module 250 may pass the analog audio signal 254 to the delay module 256. A sound mixer may feed an analog mixed signal to the audio amplifier 220 to be amplified. The sound mixer may provide the analog mixed signal to the audio amplifier 220 based on receiving the analog audio signal 254 (which may be delayed), and an analog converted version of the digital audio signal (which may be provided by conversion at a D/A process block). Power, in the form of amplifier power 234 and codec analog power 236, may be received by the audio amplifier system 200 at the audio amplifier 220 and/or the power detection module 230. The power detection module 230 may assert the power good signal 232 to the power down control module 210, based on identifying a good quality of the amplifier power 234 and/or codec analog power 236. An external power down signal 202 also may be received at the power down control module 210. Thus, the power down control module 210 may selectively assert the power down signal 212 based on various inputs and internal determinations, and may include a logic such as a truth table for evaluating whether to assert the power down signal 212 in view of the input assertions.

Thus, system 200 may include various types of functionality. First, the power detection module 230 is to determine the power good signal 232, which may be used to ensure the codec stays in a power-down mode if there is a power issue causing power good signal 232 to be deasserted. Second, the digital and analog sound detection modules 240, 250 are to enable the audio amplifier 220 to turn on when there is an audio input (digital audio signal 244 and/or analog audio signal 254), and turn off when there is no audio input, independently of the external power down signal 202. Third, the delay module 256 is to delay the analog audio signal 254, which can prevent the analog audio signal 254 from being trimmed before the audio amplifier 220 turns on. Fourth, the power down control module 210 is to detect the internal behavior of the system 200, to enable/disable the audio amplifier 220 to save power and avoid power on pop up noise.

The power detection module 230 includes power detection circuitry, within the audio codec (system 200) itself, enabling the system 200 to generate its own internal power good signal 232. Providing the internal power good signal 232 enables the power down control module 210 to ensure that the internal audio amplifier 220 may remain in a power-down mode, if the power detection module 230 determines there is some issue with external power (e.g., loss or unreliable delivery thereof). This functionality can avoid power on pop-up noise, by ensuring that the audio amplifier 220 has a quality supply of power for steady audio amplification, such that the audio amplifier 220 may be brought into active mode for unaffected audio amplification to provide amplifier out 226. In alternate examples, if some degraded quality is acceptable, e.g., some popping or noise, the power detection module 230 may be omitted. Furthermore, the power detection module 230 may separately detect two types of input power, the amplifier power 234 and the codec analog power 236. Thus, it is not needed to combine these two independent power signals, avoiding power noise cross-contamination between the two power signals. Noise or other instabilities, which may be present on one of power signals (amplifier power 234 and/or codec analog power 236), are decoupled from the other power signal, to enhance the quality of codec and amplifier performance.

Sound detection, e.g., digital sound detection module 240 and analog sound detection module 250, may be combined with and/or replace other components, such as digital-to-analog (D/A) and analog-to-analog (A/A) process blocks to process audio. The digital and analog sound detection modules 240, 250 may internally enable the audio amplifier 220 to turn on when there is sound input (digital audio signal 244 and/or analog audio signal 254), and turn off when there is no sound input. Thus, digital and analog sound detection modules 240, 250 help reduce power consumption, because the audio amplifier 220 is turned off when there is no sound input, even if the external power down signal 202 is not asserted.

The digital audio signal 244 is shown in FIG. 2 associated with a digital bus, specifically a High Definition (HD) link bus. However, the concept may be extended to other types of buses, and is not limited to any particular type of bus. Furthermore, examples may be used without specifically needing to know what types of digital protocols are being passed on the bus. For example, the digital audio signal 244 may be received on an Inter-Integrated circuit Sound (I2S) bus. The analog audio signal 254 may be passed along any type of bus or wire that is capable of carrying an analog signal, including even a single wire.

The delay module 256 is to prevent the analog audio signal 254 from being trimmed before the audio amplifier 220 transitions from the power-down mode to the active mode. The delay module 256 may be an analog circuit (e.g., NA), to receive and output analog signals. In alternate examples, the delay module 256 may be omitted, if there is some acceptability for the potential of trimming the analog audio signals 254. The analog path of system 200 may be a real-time path with the possibility of analog sounds arising at any time. Thus, when handling the analog sound detection module, the analog sound may be in a continuous input format, raising the possibility for losing a portion of the continuous input if it is interrupted by detecting and/or transitioning. This possibility of loss may be mitigated by use of the delay module 256, addressing the timing issue created by having detection for a data source that is real-time/continuous. Accordingly, the delay module 256 may copy the analog audio signal data and then delay for an amount of time to align and then reproduce the sound with up to 100% accuracy. Thus, omission of the delay module 256 may decrease the accuracy, resulting in some signal loss (potentially acceptable depending on the application, such as an analog beep notification being cut some microseconds short).

The system 200 may be controlled according to the power down control module 210, which may integrate all the internal signals for autodetecting sound for controlling the audio amplifier 220. In an example, the power down control module 210 may include a control logic that corresponds to a truth table for interpreting the various internal (and external) signals.

The power down control module 210 also may receive external signals, such as the external power down signal 202. The external power down signal 202 may be associated with being generated for codecs in personal computers (PCs), including notebook, desktop, and other computers, where different vendors may include a control chip or other circuitry to generate the external power down signal 202. Example systems 200 may reserve an external pin to receive the external power down signal 202, although in alternate examples the system 200 may omit the receiving of the external power down signal 202 (e.g., by not including an external pin). The external power down signal 202 may be given high priority or other priorities (including low priority and also being ignored) by the system 200, e.g., based on logic in the power down control module 210.

Figure 3:
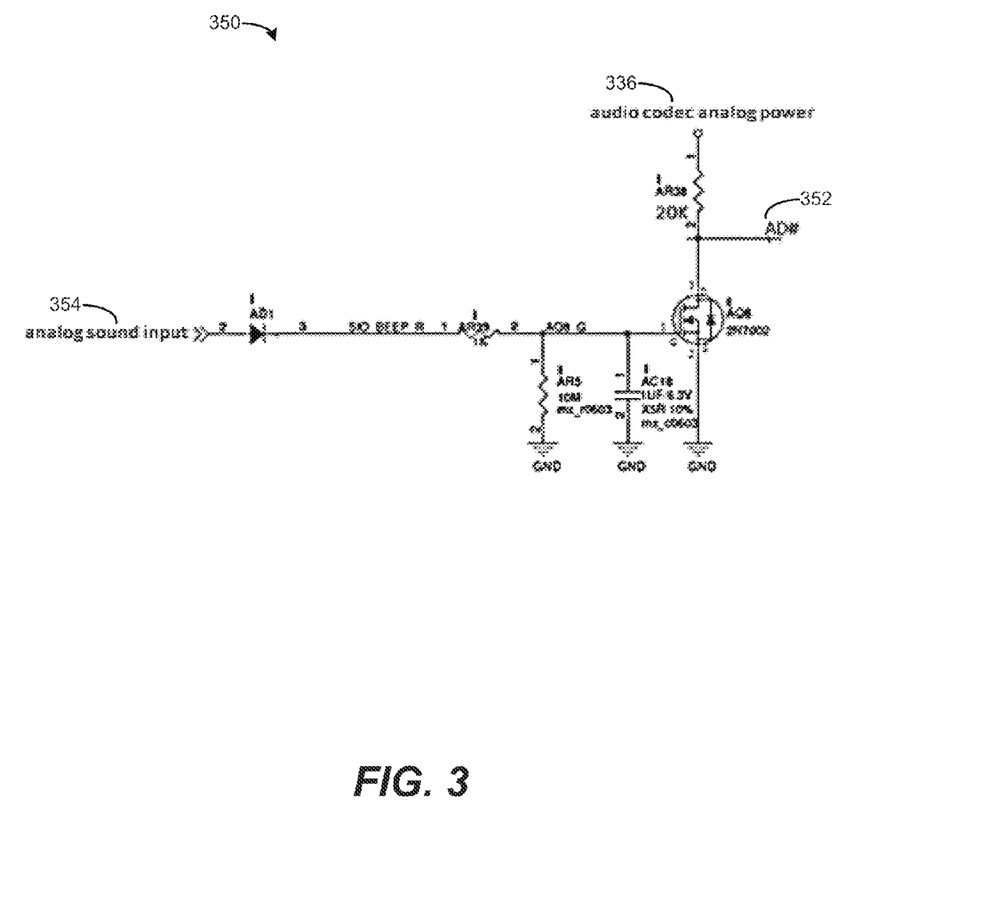
FIG. 3 is a circuit diagram of an analog sound detection module according to an example.

FIG. 3 is a circuit diagram of an analog sound detection module 350 according to an example. The sound detection module 350 may receive the codec analog power 336 and monitor for analog audio signal 354, thereby autodetecting whether the analog audio signal 354 is present. Upon detecting the analog audio signal 354, the sound detection module 350 may assert the analog detection signal 352. Other types of circuits may be used to provide the functionality of the sound detection module 350, including the autodetection feature applied to an analog audio path.

Figure 4:
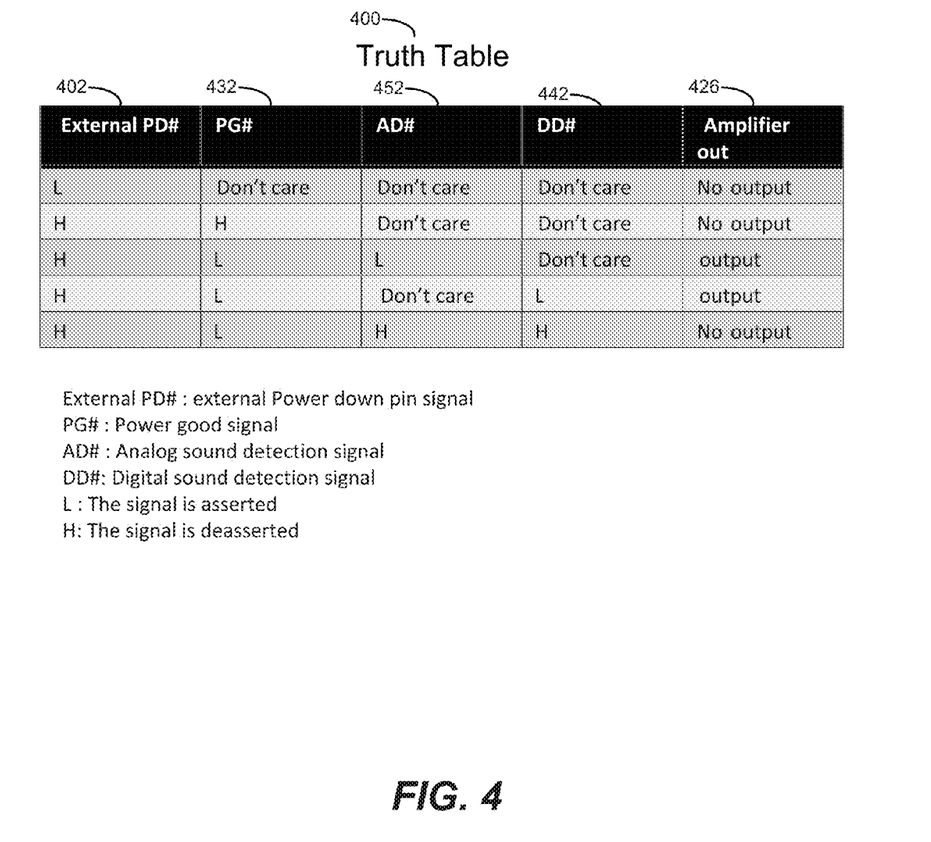
FIG. 4 is a truth table of an audio amplifier system according to an example.

FIG. 4 is a truth table 400 of an audio amplifier system according to an example. The truth table 400 indicates various output conditions for the amplifier out 426, depending on the input conditions of the external power down signal 402, power good signal 432, analog detection signal 452, and digital detection signal 442. The truth table 400 provides an example of logic that may be implemented in, e.g., a system or a module such as the power down control module shown in earlier figures.

In the example of FIG. 4, the assertion of the external power down signal 402 may be interpreted to override values for some of the other inputs (e.g., by rendering them to be in a "don't care" status), and cause the amplifier out 426 to be a "no output" condition (i.e., powered-down). However, in alternate examples, the external power down signal 402 may be overridden or even eliminated (e.g., by use of autodetection features and/or by use of an internal power down signal), such that assertion of the external power down signal 402 may not cause other inputs to assume a "don't care" status.

The first row of truth table 400 shows assertion of the external power down signal 402. For example, an external source may be indicating to the codec that the amplifier should shut down, e.g., when a computer is entering a sleep mode independent of whether sound is being detected. Accordingly, the corresponding values for power good signal 432, analog detection signal 452, and digital detection signal 442 assume a "don't care" status and the amplifier out 426 is "no output."

The second row of truth table 400 shows deassertion of the external power down signal 402, and deassertion of the power good signal 432. For example, there may be some problem with the amplifier power and/or the codec analog power being fed to the codec, such as a loss of power or noisy power signal. Accordingly, due to power issues (e.g., a power loss in either type of power), the amplifier out 426 is "no output," and the corresponding values for analog detection signal 452 and digital detection signal 442 assume a "don't care" status.

The third row of truth table 400 shows deassertion of the external power down signal 402, and assertion of the power good signal 432 and analog detection signal 452. For example, an analog audio signal may be received at an analog sound detection module. Accordingly, because at least the analog detection signal 452 and/or the digital detection signal 442 is asserted, the corresponding value for the amplifier out 426 is "output," e.g., to output the detected analog audio signal. The digital detection signal 442 assumes a "don't care" status, because the amplifier is to output at least the detected analog sound, regardless of whether digital sound is also received.

The fourth row of truth table 400 shows deassertion of the external power down signal 402, and assertion of the power good signal 432 and digital detection signal 442. For example, a digital audio signal may be received at a digital sound detection module. Accordingly, because at least the digital detection signal 442 and/or the analog detection signal 452 is asserted, the corresponding value for the amplifier out 426 is "output," e.g., to output the detected digital audio signal. The analog detection signal 452 assumes a "don't care" status, because the amplifier is to output at least the detected digital sound, regardless of whether analog sound is also received.

The fifth row of truth table 400 shows deassertion of the external power down signal 402, and assertion of the power good signal 432. Both the analog detection signal 452 and the digital detection signal 442 are deasserted. For example, neither an analog audio signal nor a digital audio signal are received at the codec. Accordingly, because no audio is being received to be amplified, the amplifier out 426 may assume a "no output" value. This illustrates an example of sound autodetection, because the logic instructs the amplifier to power down to no output when there is no sound to be amplified, even though the external power down signal 402 is deasserted. Accordingly, the amplifier can conserve power.

The truth table may include additional logic combinations and states, based on additional rows and columns of features to be combined that are not specifically illustrated in FIG. 4, consistent with the various examples provided throughout the present disclosure. The "L" and "H" representations are arbitrarily chosen in the truth table 400 to represent assertion and deassertion, and may be reversed in the truth table, with corresponding adjustments to establish a stable logic to the truth table. Thus, the truth table 400 enables autodetection of analog and digital audio signals, while ensuring a power good signal (e.g., for those examples where a power detection module is included).

Figure 5:
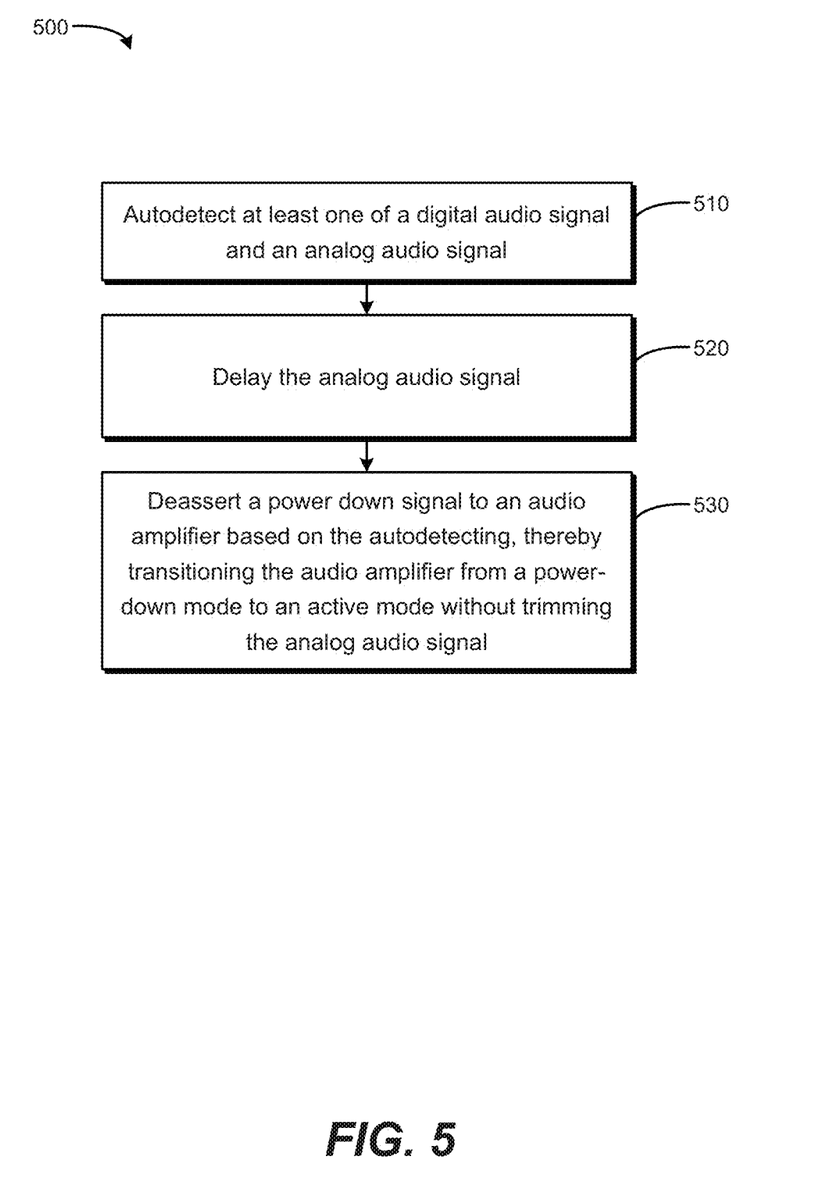
FIG. 5 is a flow chart based on autodetecting audio signals according to an example.

Referring to FIG. 5, a flow diagram is illustrated in accordance with various examples of the present disclosure. The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 5 is a flow chart 500 based on autodetecting audio signals according to an example. In block 510, at least one of a digital audio signal and an analog audio signal is autodetected. For example, a power down control module may receive an assertion indicating the presence of an audio signal, enabling the power down control module to deassert a power down signal to an audio amplifier. In block 520, the analog audio signal is delayed. For example, a sample-and-hold circuit may be used to capture an analog beep signal for a duration and then play the signal after a delay. In block 530, a power down signal to an audio amplifier is deasserted based on the autodetecting, thereby transitioning the audio amplifier from a power-down mode to an active mode without trimming the analog audio signal. For example, the power down control module may rely on a logic truth table to autodetect an audio signal and instruct the audio amplifier to enter active mode. The delayed analog audio may then be received by the audio amplifier after it is in the active mode, without causing a pop noise or other distortion to be introduced to the sound, while enjoying reduced power consumption by allowing the audio amplifier to remain in a power-down mode for longer periods of time.

Examples provided herein may be implemented in hardware, software, or a combination of both. Example systems can include a processor and memory resources for executing instructions stored in a tangible non-transitory medium (e.g., volatile memory, non-volatile memory, and/or computer readable media). Non-transitory computer-readable medium can be tangible and have computer-readable instructions stored thereon that are executable by a processor to implement examples according to the present disclosure.

An example system (e.g., a computing device) can include and/or receive a tangible non-transitory computer-readable medium storing a set of computer-readable instructions (e.g., software). As used herein, the processor can include one or a plurality of processors such as in a parallel processing system. The memory can include memory addressable by the processor for execution of computer readable instructions. The computer readable medium can include volatile and/or non-volatile memory such as a random access memory ("RAM"), magnetic memory such as a hard disk, floppy disk, and/or tape memory, a solid state drive ("SSD"), flash memory, phase change memory, and so on.

What is claimed is:

1. A system comprising:
an audio amplifier to transition between a power-down mode and an active mode based on assertion and deassertion of a power down signal;
a power down control module to selectively assert and deassert the power down signal to the audio amplifier based on a digital detection signal and an analog detection signal;
an analog sound detection module to:
detect an analog audio signal, and
generate the analog detection signal based on detecting the analog audio signal;
a digital sound detection module to:
detect a digital audio signal, and
generate the digital detection signal based on detecting the digital audio signal; and
a delay module to:
receive the analog audio signal from the analog sound detection module,
delay the analog audio signal for a predetermined amount of time, wherein the predetermined amount of time is long enough for the audio amplifier to transition from the power-down mode to the active mode, and
output the delayed analog audio signal to the audio amplifier,
wherein the power down control module is to deassert the power down signal based on an external power down signal being deasserted, a power good signal being asserted, and either the analog detection signal or the digital detection signal being asserted.

2. The system of claim 1, further comprising a power detection module to detect a power good condition, and based on the detection, assert the power good signal to the power down control module; wherein the power down control module is to selectively assert and deassert the power down signal to the audio amplifier, based on identifying the power good signal.

3. The system of claim 2, wherein the power detection module is to detect the power good condition based on at least one of an amplifier power and a codec analog power available to the system.

4. The system of claim 3, wherein the power detection module is to deassert the power good signal upon detecting a problem with at least one of the amplifier power and the codec analog power.

5. The system of claim 3, wherein the power detection module is to detect the power good condition based on a good quality of the amplifier power and the codec analog power available to the system.

6. The system of claim 1, wherein the digital sound detection module is to detect the digital audio signal from a high definition (HD) audio link bus.

7. The system of claim 1, wherein the digital sound detection module is to detect the digital audio signal from an Inter-Integrated circuit Sound (I2S) interface.

8. The system of claim 1, wherein the power down control module is to selectively assert and deassert the power down signal to the audio amplifier based on receiving the external power down signal.

9. The system of claim 1, wherein the audio amplifier is to receive amplifier power, and wherein the power down control module is to selectively assert and deassert the power down signal to the audio amplifier based on a quality of the amplifier power.

10. The system of claim 1, wherein the audio amplifier produces no output in the power-down mode.

11. The system of claim 1, further comprising a digital-to-analog converter to convert the digital audio signal to an analog version; and
a sound mixer to:
produce an analog mixed signal based on the delayed analog audio signal and the analog version of the digital audio signal, and
output the analog mixed signal to the amplifier.

12. The system of claim 11, wherein the digital sound detection module is to receive a digital audio signal produced by a software driver, and wherein the analog sound detection module is to receive an analog audio signal comprising an analog beep signal from a personal computer.

13. The system of claim 1, wherein the power down control module is to assert the power down signal otherwise.

14. A system comprising:
an audio amplifier to transition between a power-down mode and an active mode based on assertion and deassertion of a power down signal;
a power detection module to detect an amplifier power and a codec analog power, and based on the detection, selectively assert a power good signal;
a digital sound detection module to selectively assert a digital detection signal based on detecting a digital audio signal;
an analog sound detection module to selectively assert an analog detection signal based on detecting an analog audio signal;

a delay module to delay the analog audio signal for a predetermined amount of time, wherein the predetermined amount of time is long enough for the audio amplifier to transition from the power-down mode to the active mode; and a power down control module to selectively assert and deassert the power down signal to the audio amplifier, based on the power good signal, the digital detection signal, and the analog detection signal.

15. The system of claim 14, wherein the power down control module is to selectively assert and deassert the power down signal based on an external power down signal.

16. A method, comprising:
autodetecting a digital audio signal;
autodetecting an analog audio signal;
delaying the analog audio signal for a predetermined amount of time, wherein the predetermined amount of time is long enough for the audio amplifier to transition from the power-down mode to the active mode; and deasserting a power down signal to an audio amplifier based on the autodetecting of the analog audio signal, thereby transitioning the audio amplifier from a power-down mode to an active mode without trimming the analog audio signal, wherein deasserting the power down signal comprises selectively asserting and deasserting the power down signal based on a power good signal, autodetecting of the digital audio signal, and autodetecting of the analog audio signal.

17. The method of claim 16, further comprising individually monitoring, by a power detection module, an amplifier power and a codec analog power, thereby decoupling the amplifier power from the codec analog power; identifying an issue with at least one of the amplifier power and the codec analog power; and deasserting the power good signal, thereby asserting the power down signal to the audio amplifier.

* * * * *